(12) United States Patent
Okabe et al.

(10) Patent No.: US 7,788,882 B2
(45) Date of Patent: Sep. 7, 2010

(54) PACKAGING DEVICE AND PACKAGING METHOD FOR HOLLOW CATHODE TYPE SPUTTERING TARGET

(75) Inventors: Takeo Okabe, Ibaraki (JP); Masaru Nagasawa, Ibaraki (JP)

(73) Assignee: Nippon Mining & Metals Co., Ltd., Tokyo (JP)

( * ) Notice: Subject to any disclaimer, the term of this patent is extended or adjusted under 35 U.S.C. 154(b) by 1069 days.

(21) Appl. No.: 10/575,937

(22) PCT Filed: Sep. 14, 2004

(86) PCT No.: PCT/JP2004/013343
§ 371 (c)(1), (2), (4) Date: Apr. 13, 2006

(87) PCT Pub. No.: WO2005/037649
PCT Pub. Date: Apr. 28, 2005

(65) Prior Publication Data
US 2007/0131545 A1 Jun. 14, 2007

(30) Foreign Application Priority Data
Oct. 15, 2003 (JP) .............................. 2003-354456

(51) Int. Cl.
*B65B 31/00* (2006.01)
*B67B 3/24* (2006.01)
(52) U.S. Cl. .................. 53/403; 53/396; 204/192.1; 204/298.12; 220/23.9; 220/651; 220/890
(58) Field of Classification Search .............. 204/192.1, 204/298.12, 298.19; 53/396, 403; 220/23.9, 220/651, 890
See application file for complete search history.

(56) References Cited

U.S. PATENT DOCUMENTS

| | | | | |
|---|---|---|---|---|
| 5,336,386 A | * | 8/1994 | Marx et al. ............. | 204/298.12 |
| 5,687,600 A | | 11/1997 | Emigh et al. | |
| 6,153,315 A | | 11/2000 | Yamakoshi et al. | |
| 6,283,357 B1 | | 9/2001 | Kulkami et al. | |
| 6,342,133 B2 | | 1/2002 | D'Couto et al. | |
| 6,500,321 B1 | * | 12/2002 | Ashtiani et al. ......... | 204/298.12 |
| 6,887,356 B2 | | 5/2005 | Ford et al. | |
| 2004/0245099 A1 | | 12/2004 | Hukushima | |

FOREIGN PATENT DOCUMENTS

WO 00/32347 A1 6/2000

OTHER PUBLICATIONS http://www.merriam-webster.com/dictionary/resin [Accessed on Sep. 16, 2009].*

(Continued)

*Primary Examiner*—Alexa D Neckel
*Assistant Examiner*—Michael Band
(74) *Attorney, Agent, or Firm*—Howson & Howson LLP

(57) ABSTRACT

Provided are a packaging device and packaging method of a hollow cathode sputtering target which installs, in the hollow cathode sputtering target, a cover of a size capable of covering a void of the target; provides one or more through-holes to the cover; places a resin bag over them, and performs vacuum suction to the inside of the bag. This packaging device and packaging method of a hollow cathode sputtering target is capable of performing vacuum suction even to the inside of the hollow portion covered with the resin bag.

7 Claims, 1 Drawing Sheet

OTHER PUBLICATIONS

ESP@CENET Database, English Abstract of JP 04-231461, Aug. 20, 1992.
ESP@CENET Database, English Abstract of JP 2001-240959, Sep. 4, 2001.
ESP@CENET Database, English Abstract of JP 2000-256843, Sep. 19, 2000.
ESP@CENET Database, English Abstract of JP 2003-000139, Jan. 7, 2003.
ESP@CENET Database, English Abstract of JP 06-199324, Jul. 19, 1994.

* cited by examiner

PACKAGING DEVICE AND PACKAGING METHOD FOR HOLLOW CATHODE TYPE SPUTTERING TARGET

BACKGROUND OF THE INVENTION

The present invention relates to a packaging device and packaging method of a hollow cathode sputtering target capable of preventing the adhesion of dust and dirt, and preventing humidity and oxidization.

In recent years, the sputtering method for forming a film from materials such as metal or ceramics has been used in numerous fields such as electronics, corrosion resistant materials and ornaments, catalysts, as well as in the manufacture of cutting/grinding materials and abrasion resistant materials.

Although the sputtering method itself is a well-known method in the foregoing fields, recently, particularly in the field of electronics, a sputtering target suitable for forming films of complex shapes and forming circuits is in demand.

Under the foregoing circumstances, a hollow cathode sputtering target has been proposed in recent days. This target takes on a cup shape, and the name "hollow cathode sputtering target" derives from this shape (e.g., refer to Patent Documents 1, 2, 3).

This hollow cathode sputtering target is capable of generating high density plasma within the target, and, by further adding directivity to the sputtering direction, a performance is yielded where it is possible to fill via holes in a high aspect ratio without having to use the conventional collimator.

This kind of hollow cathode sputtering target has the function of a deposition method capable of forming a film more efficiently and with more control in comparison to a conventional flat-plate target.

Generally speaking, in order to ship and store a flat-plate target, such target is placed inside a resin bag, and the inside is subject to vacuum suction or inert gas is introduced therein so as to prevent the adhesion of dirt and oxidization (e.g., refer to Patent Documents 4, 5).

[Patent Document 1]
Japanese Patent Laid-Open Publication No. 2000-256843
[Patent Document 2]
Japanese Patent Laid-Open Publication No. 2001-98367
[Patent Document 3]
Translation of Publication of International Application No. 2002-531690
[Patent Document 4]
Japanese Patent Laid-Open Publication No. H4-231461
[Patent Document 5]
Japanese Patent Laid-Open Publication No. 2001-240959

The method of performing vacuum suction with this kind of bag is effective in preventing the adhesion of dirt and oxidization. Nevertheless, when this is applied to a hollow cathode sputtering target, there is a difficult problem in terms of structure.

As shown in FIG. 2, a bag 3 adheres (is tethered to) a peripheral edge 2 of a hollow cathode sputtering target 1, a void 4 cannot be sucked sufficiently, and there is a problem in that this is an insufficient preventive measure for preventing oxidization.

Further, since the void 4 will be decompressed, there is another problem in that the resin bag will be pulled inward, and tension thereof could cause the bag to burst. Reference numeral 7 in FIG. 2 represents a vacuum suction unit.

SUMMARY OF THE INVENTION

Thus, an object of the present invention is to provide a packaging device and packaging method of a hollow cathode sputtering target capable of performing vacuum suction even to the inside of the hollow portion covered with the resin bag.

The present inventors discovered that the foregoing problems could be overcome by providing a cover for covering the void of the hollow cathode sputtering target, and devising such cover in a certain way.

Based on the foregoing discovery, the present invention provides: 1) a packaging device of a hollow cathode sputtering target, including: a hollow cathode sputtering target; a cover of a size capable of covering a void of the target, one or more through-holes provided to the cover, a resin bag of a size capable of covering them all, and a device for performing vacuum suction to the inside of the bag; 2) the packaging device of a hollow cathode sputtering target according to 1) above, wherein the cover is transparent resin; 3) the packaging device of a hollow cathode sputtering target according to 1) or 2) above, wherein the resin bag is a bag that is impermeable to oxygen and moisture; and 4) the packaging device of a hollow cathode sputtering target according to any one of 1) to 3) above, wherein the cover has rigidity, and is formed from a flat plate that is capable of maintaining its shape after the vacuum suction.

The present invention also provides: 5) a packaging method of a hollow cathode sputtering target, including the steps of installing a cover of a size capable of covering a void of the target; providing one or more through-holes to the cover;

placing a resin bag over them, and performing vacuum suction to the inside of the bag; 6) the packaging method of a hollow cathode sputtering target according to 5) above, wherein the cover is transparent resin; 7) the packaging method of a hollow cathode sputtering target according to 5) or 6) above, wherein the resin bag is a bag that is impermeable to oxygen and moisture; and 8) the packaging method of a hollow cathode sputtering target according to any one of 5) to 7) above, wherein the cover has rigidity, and is formed from a flat plate that is capable of maintaining its shape after the vacuum suction.

The present invention yields a superior effect in that it is capable of evacuating the void of the target via the through-holes provided to the cover upon performing vacuum suction to the hollow cathode sputtering target covered with a resin bag, and, in the void to become the eroded portion of the target, it is possible to maintain the cleansed target surface without even once coming in contact with the packaging resin. Therefore, a significant effect is yielded in that it is possible to further prevent the adhesion of dust and dirt and prevent humidity and oxidization in comparison to conventional methods.

DETAILED DESCRIPTION OF THE INVENTION

Figure 1:
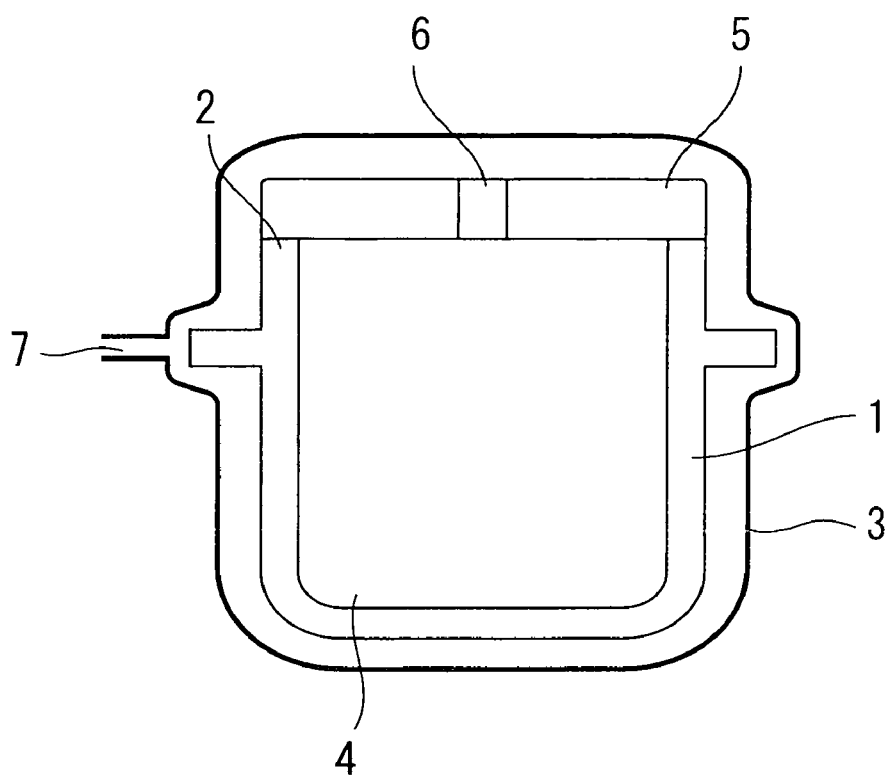
FIG. 1 is a cross-sectional schematic diagram for explaining the packaging of a hollow cathode sputtering target of the present invention.
Figure 2:
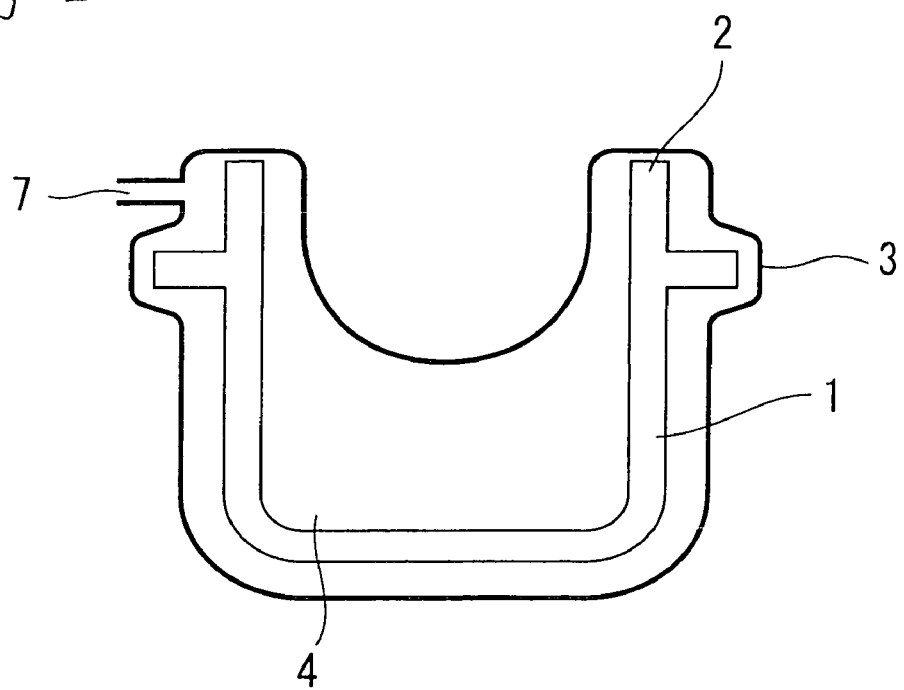
FIG. 2 is a cross-sectional schematic diagram for explaining the problems arising in the conventional packaging of a hollow cathode sputtering target.

The hollow cathode sputtering target of the present invention is now explained with reference to FIG. 1. FIG. 1 is a view showing a frame format of a representative shape of the hollow cathode sputtering target 1.

Here, although the cross section is taking on a U-shape, there is no particular limitation on this shape, and the present invention is applicable to all targets as long as the target has voids inside; for instance, targets having a W-shaped cross section. The present invention covers all such shapes.

Further, there is no particular limitation on the target material, and various metals, alloys, and ceramics of silicon compounds and oxides may be used. In order to manufacture a hollow body (cup shape), processing methods such as forging, rolling, thread rolling, deep drawing and the like are performed. There is also no limitation on these manufacturing methods.

Generally, the inner face of the hollow cathode sputtering target 1 becomes the eroded face, and such inner face is smoothed stringently. Therefore, deterioration of such inner face of the target due to adhesion of dust, damage, oxidization and so on must be avoided.

The present invention provides a cover 5 for protecting the void 4. Through-holes 6 are provided to this cover 5. The cover 5 shall be formed from a material having rigidity which will not excessively deform or bend upon vacuum suction. Although a flat plate will normally suffice, a bar or handle for reinforcement may be provided, or it may be other three-dimensional shapes.

To allow the inside of the cover to be observed, it is desirable that the cover is transparent, and it is also desirable that the resin bag is a bag that practically does not permeate oxygen and moisture (humidity).

Incidentally, although it is desirable that the resin bag is able to completely shut off oxygen and moisture (humidity), this does not necessarily have to be the case. In other words, the meaning of "a bag that does not permeate oxygen and moisture (humidity)" of the present invention implies that the bag is able to shut out the oxygen and moisture (humidity) to a degree of not being substantially influenced by such oxygen and moisture (humidity) at least upon shipping or storing the sputtering target. The present invention shall cover all of the foregoing cases.

One or more through-holes 6 are provided to the cover 5, and these play an important role during vacuum suction. This is because the hollow portion 4 can be evacuated through these through-holes 6.

The cover 5 is placed on the target 1, the bag 3 formed from polyvinyl chlorine or the like is covered thereon, and vacuum suction is performed through the vacuum suction unit 7. Although the vacuum suction device is not shown, a generally used suction device may be used.

When evacuating the hollow portion 4 through the through-holes 6 provided to the cover 5, the bag will not adhere to the peripheral edge 2 of the target, and an incomplete evacuation will not occur.

After evacuation, an inert gas may be introduced therein, or this may be stored and shipped in such evacuated state. As a result, it is possible to effectively prevent the adhesion of dust and dirt on the inner face of the target, and prevent humidity and oxidization.

Further, in the void to become the eroded portion of the target, there will no longer be any contact from above the packaging resin, and risks of the inner face of the target becoming damaged will decrease considerably. Moreover, even the packaging resin will not be touched. Therefore, a significant effect is yielded in that the cleansed target surface can be maintained as is.

The present invention is optimal for packaging a hollow cathode sputtering target since it is able to prevent the adhesion of dust and dirt as well as effectively prevent humidity and oxidization on the inner surface of a target having a void.

The invention claimed is:

1. A packaging method of a hollow cathode sputtering target, comprising the steps of installing a cover of a size capable of covering a void of said hollow cathode sputtering target; providing one or more through-holes to said cover; placing a resin bag over said through-holes, and performing vacuum suction to the inside of said bag, said cover being rigid and formed from a flat plate capable of maintaining its shape after said step of performing vacuum suction.

2. The packaging method of a hollow cathode sputtering target according to claim 1, wherein said cover is transparent resin.

3. A method according to claim 2, wherein said resin bag is impermeable to oxygen and moisture.

4. A method according to claim 1, wherein said resin bag is impermeable to oxygen and moisture.

5. A method according to claims 1, wherein the hollow cathode sputtering target is cup-shaped and has a rim defining an open mouth of a predetermined diameter, and a depth of the cup-shaped hollow cathode sputtering target is at least as great as the predetermined diameter.

6. A method according to claim 1, wherein the hollow cathode sputtering target is cup-shaped and has a rim defining an open mouth; wherein the through-holes extend transversely through the flat plate; and wherein the flat plate is supported on and contacts only the rim of the cup-shaped hollow cathode sputtering target and does not extend below the rim.

7. A method of a packaging a sputtering target, comprising the steps of:

obtaining a hollow cathode sputtering target for packaging, the hollow cathode sputtering target being cup-shaped, defining a void therein, and having a rim defining an open mouth of a predetermined diameter, and a depth of the cup-shaped hollow cathode sputtering target being at least as great as the predetermined diameter;

installing a cover of a size capable of covering the void of the hollow cathode sputtering target, the cover consisting of a transparent, rigid, flat plate having one or more through-holes extending transversely through the flat plate, the flat plate being supported on and contacting only the rim of the cup-shaped hollow cathode sputtering target and not extending below the rim;

after said step of installing the cover, placing the hollow cathode sputtering target and cover inside a resin bag impermeable to oxygen and moisture, and after said step of placing the hollow cathode sputtering target and cover inside the resin bag, performing vacuum suction to an inside of the bag.

* * * * *